(12) United States Patent
Xiao

(10) Patent No.: US 10,609,841 B2
(45) Date of Patent: Mar. 31, 2020

(54) LIQUID COOLING RADIATION SYSTEM AND LIQUID RADIATOR THEREOF

(71) Applicant: SHENZHEN APALTEK CO., LTD., Shenzhen, Guangdong (CN)

(72) Inventor: Qineng Xiao, Dongguan (CN)

(73) Assignee: SHENZHEN APALTEK CO., LTD., Shenzhen, Guangdong (CN)

( * ) Notice: Subject to any disclaimer, the term of this patent is extended or adjusted under 35 U.S.C. 154(b) by 210 days.

(21) Appl. No.: 15/541,706

(22) PCT Filed: Jan. 11, 2017

(86) PCT No.: PCT/CN2017/070823
§ 371 (c)(1),
(2) Date: Jul. 5, 2017

(87) PCT Pub. No.: WO2017/088840
PCT Pub. Date: Jun. 1, 2017

(65) Prior Publication Data
US 2017/0367217 A1    Dec. 21, 2017

(30) Foreign Application Priority Data

Nov. 12, 2015  (CN) .......................... 2015 1 0769643

(51) Int. Cl.
*H05K 7/20*   (2006.01)
*F28D 1/053*  (2006.01)
(Continued)

(52) U.S. Cl.
CPC ..... *H05K 7/20272* (2013.01); *F28D 1/05375* (2013.01); *G06F 1/203* (2013.01);
(Continued)

(58) Field of Classification Search
CPC ....... H01L 23/40; H01L 23/46; H01L 23/473; H01L 23/3672; H01L 23/467;
(Continued)

(56) References Cited

U.S. PATENT DOCUMENTS 5,149,253 A * 9/1992 Miyamoto .......... F04D 13/0646
                                              310/156.21
6,955,212 B1 * 10/2005 Hsieh ...................... F28D 1/024
                                              165/80.4
(Continued)

FOREIGN PATENT DOCUMENTS

CN      207987285 U  * 10/2018
DE  202012009586 U1 * 12/2012  ......... H05K 7/20272
(Continued)

OTHER PUBLICATIONS

The Impact of Component Material Selection on Pump Reliability—BURDIS (Dec. 2014) (Year: 2014).*

*Primary Examiner* — Cassey D Bauer
*Assistant Examiner* — Jenna M Hopkins
(74) *Attorney, Agent, or Firm* — Chun-Ming Shih; HDLS IPR Services

(57) ABSTRACT

Disclosed is a liquid cooling radiation system. The technical solution used by the present invention to solve the technical problem is: the liquid cooling radiation system comprises: a radiation device, comprising cooling pipes and a radiation structure device arranged on the cooling pipes; a pumping device, integrally arranged between the cooling pipes and generating power so that a coolant circulates within the cooling pipes; a heat absorption device, attached to a heating device and having a heat conduction effect with the heating device; a pipeline, used for connecting the radiation device and the heat absorption device. On the basis of existing products, the present invention utilises a solution wherein a liquid pump main body and a radiator are integrally arranged (Continued)

together. Thus, the radiation of a fan is used to take away heat on the radiator and heat generated by a pump power main body (i.e. a motor) itself is also taken away, thereby extending the service life of the motor. In addition, the occupied space is significantly reduced, the heat transfer effect is significantly improved, and the production and assembly costs are reduced, so that product assembly is convenient and efficiency is high.

6 Claims, 3 Drawing Sheets

(51) Int. Cl.
| | | |
|---|---|---|
| H01L 23/367 | (2006.01) | |
| H01L 23/467 | (2006.01) | |
| H01L 23/473 | (2006.01) | |
| H01L 21/48 | (2006.01) | |
| H01L 23/46 | (2006.01) | |
| H01L 23/40 | (2006.01) | |
| G06F 1/20 | (2006.01) | |
| F28D 21/00 | (2006.01) | |

(52) U.S. Cl.
CPC ...... *H01L 21/4882* (2013.01); *H01L 23/3672* (2013.01); *H01L 23/40* (2013.01); *H01L 23/46* (2013.01); *H01L 23/467* (2013.01); *H01L 23/473* (2013.01); *H01L 23/4735* (2013.01); *H05K 7/20* (2013.01); *F28D 2021/0031* (2013.01); *F28F 2250/08* (2013.01); *G06F 1/20* (2013.01); *G06F 2200/201* (2013.01); *H01L 2924/0002* (2013.01); *H05K 7/20263* (2013.01); *H05K 7/20409* (2013.01)

(58) Field of Classification Search
CPC ......... H01L 23/4735; H01L 2924/0002; H01L 21/4882; H05K 7/20; H05K 7/20272; H05K 7/20263; F28D 1/05375; F28D 2021/0031; F28F 2250/08; G06F 1/20; G06F 1/203
See application file for complete search history.

(56) References Cited

U.S. PATENT DOCUMENTS

| | | | | |
|---|---|---|---|---|
| 10,058,007 B2* | 8/2018 | Chiu | ................. | H05K 7/20263 |
| 2002/0186532 A1* | 12/2002 | Tomioka | ............ | H05K 7/20154 |
| | | | | 361/695 |
| 2003/0007325 A1* | 1/2003 | Thunem | ................. | G06F 1/20 |
| | | | | 361/679.46 |
| 2004/0234398 A1* | 11/2004 | Hu | ....................... | F04D 29/023 |
| | | | | 417/423.7 |
| 2005/0243520 A1* | 11/2005 | Tomioka | ............ | F04D 29/5866 |
| | | | | 361/702 |
| 2006/0005945 A1* | 1/2006 | Wei | ....................... | H01L 23/467 |
| | | | | 165/80.3 |
| 2006/0018775 A1* | 1/2006 | Oikawa | .................. | F04B 53/08 |
| | | | | 417/423.14 |
| 2006/0034055 A1* | 2/2006 | Mok | ....................... | G06F 1/203 |
| | | | | 361/700 |
| 2006/0137863 A1* | 6/2006 | Lee | .......................... | G06F 1/20 |
| | | | | 165/104.33 |
| 2006/0185378 A1* | 8/2006 | Duan | ................. | H05K 7/20263 |
| | | | | 62/259.2 |
| 2007/0023167 A1* | 2/2007 | Liu | ....................... | H01L 23/473 |
| | | | | 165/80.4 |
| 2007/0039719 A1* | 2/2007 | Eriksen | ..................... | G06F 1/20 |
| | | | | 165/104.31 |
| 2007/0193720 A1* | 8/2007 | Horng | ................... | F28D 15/00 |
| | | | | 165/104.9 |
| 2008/0105407 A1* | 5/2008 | Yeh | ........................ | H01L 23/467 |
| | | | | 165/104.28 |
| 2008/0190586 A1* | 8/2008 | Robinson | .................. | F28F 3/12 |
| | | | | 165/80.4 |
| 2008/0295534 A1* | 12/2008 | Farrow | ................. | F04C 18/086 |
| | | | | 62/259.2 |
| 2009/0044929 A1* | 2/2009 | Yeh | ...................... | F28D 1/05391 |
| | | | | 165/104.19 |
| 2009/0139698 A1* | 6/2009 | Robinson | .............. | H01L 23/473 |
| | | | | 165/104.31 |
| 2010/0014244 A1* | 1/2010 | Cao | ....................... | H01L 23/3672 |
| | | | | 361/679.48 |
| 2011/0020143 A1* | 1/2011 | Van Brunt | .............. | F04B 17/04 |
| | | | | 417/53 |
| 2011/0100612 A1* | 5/2011 | Tang | ......................... | G06F 1/20 |
| | | | | 165/104.33 |
| 2011/0141693 A1* | 6/2011 | Walsh | .................. | F04D 29/4226 |
| | | | | 361/702 |
| 2011/0232885 A1* | 9/2011 | Kaslusky | ............... | H01L 23/467 |
| | | | | 165/177 |
| 2012/0125575 A1* | 5/2012 | Yang | ........................ | F28D 15/00 |
| | | | | 165/120 |
| 2012/0138269 A1* | 6/2012 | Holahan | ............... | F04D 13/024 |
| | | | | 165/104.19 |
| 2013/0011255 A1* | 1/2013 | Horng | ..................... | F04D 17/04 |
| | | | | 415/226 |
| 2013/0170970 A1* | 7/2013 | Ozaki | ................... | A61M 1/101 |
| | | | | 415/203 |
| 2013/0202908 A1* | 8/2013 | Kusinski | ................... | F16L 9/02 |
| | | | | 428/544 |
| 2013/0287875 A1* | 10/2013 | Yoshimi | ............. | B29D 30/0662 |
| | | | | 425/44 |
| 2013/0299139 A1* | 11/2013 | Mounioloux | ............. | F28D 1/04 |
| | | | | 165/120 |
| 2013/0319648 A1* | 12/2013 | Pantow | ................... | F28F 1/128 |
| | | | | 165/185 |
| 2014/0008039 A1* | 1/2014 | Liu | ......................... | F28D 15/00 |
| | | | | 165/104.13 |
| 2014/0069614 A1* | 3/2014 | Chiu | ....................... | F28D 15/00 |
| | | | | 165/104.13 |
| 2014/0216694 A1* | 8/2014 | Tsai | ......................... | F28D 15/00 |
| | | | | 165/104.31 |
| 2014/0216695 A1* | 8/2014 | Tsai | ....................... | H01L 23/473 |
| | | | | 165/104.31 |
| 2014/0290908 A1* | 10/2014 | Wang | .................. | F28D 15/0266 |
| | | | | 165/80.2 |
| 2014/0345839 A1* | 11/2014 | Rodrigo Marco | ........ | F01N 5/02 |
| | | | | 165/172 |
| 2015/0116928 A1* | 4/2015 | Delano | ..................... | G06F 1/20 |
| | | | | 361/679.47 |
| 2015/0138722 A1* | 5/2015 | French, Jr. | ................ | G06F 1/20 |
| | | | | 361/679.47 |
| 2015/0342091 A1* | 11/2015 | Scharinger | ......... | H05K 7/20909 |
| | | | | 165/80.3 |
| 2015/0369252 A1* | 12/2015 | Janecek | ................ | H02K 21/145 |
| | | | | 417/420 |
| 2016/0205807 A1* | 7/2016 | Chang | .................. | H01L 23/473 |
| | | | | 165/80.4 |
| 2016/0234968 A1* | 8/2016 | Huang | .................. | H01L 23/427 |
| 2016/0366788 A1* | 12/2016 | Liao | .................. | H05K 7/20272 |
| 2016/0381828 A1* | 12/2016 | Yin | ........................ | G06F 1/16 |
| | | | | 165/104.31 |
| 2017/0023317 A1* | 1/2017 | Zhang | ....................... | F28F 9/26 |
| 2017/0027081 A1* | 1/2017 | Zhang | ................ | H05K 7/20272 |
| 2017/0118870 A1* | 4/2017 | Yin | ...................... | F04D 29/5806 |
| 2018/0320701 A1* | 11/2018 | Shen | ...................... | F04D 29/044 |
| 2019/0041105 A1* | 2/2019 | Yin | ......................... | F25B 21/02 |

FOREIGN PATENT DOCUMENTS

| | | | | |
|---|---|---|---|---|
| DE | 202015105831 U1 * | 11/2015 | .......... | H01L 23/473 |
| EP | 1881394 A1 * | 1/2008 | .............. | G06F 1/20 |
| JP | 2006234255 A * | 9/2006 | | |
| WO | WO-2016153488 A1 * | 9/2016 | .............. | G06F 1/20 |

\* cited by examiner

LIQUID COOLING RADIATION SYSTEM AND LIQUID RADIATOR THEREOF

BACKGROUND OF THE PRESENT INVENTION

Field of Invention

The present invention relates to a liquid cooling system, and more particularly to a liquid cooling system which includes a pump body integrally arranged inside a heat dissipating arrangement.

Description of Related Arts

At present, water-cooled radiators are commonly used as the cooling devices for cooling down devices such as computer CPU, graphic cards, chips of electronic equipment and are basically consist of three major components, which are heat absorbing device, pumping power device and heat dissipating device. The three components are connected to form a closed loop for liquid circulation in which the heat absorbing device is connected to the heat dissipating device while the pumping power device provides power to liquid circulation in the loop. The drawback of this design is that the three components are assembled and affixed by external connection through connecting pipes, thus a relatively large space is utilized and its installation and operation is inconvenience. In view of the relatively high installation requirement for space and poor flexibility in installation, its application is very limited. Patent number 200580050009.2 is targeted at solving the present problem and provides a cooling system for computer system which incorporates a heat exchange interface, a liquid storage compartment and a pump as one part of an integrated component, of which the pump is superimposed on the heat absorbing device. This integration arrangement will lead to the heat absorbing device having a size which is not suitable for fitting into the small space, the pumping device which is arranged on top of the heat absorbing arrangement will be easily affected by the high temperature and resulted in damage, thus its lifespan is affected. At present, the position of the pumping power device in this kind of heat dissipating device is unreasonable, resulting in low work efficiency of the pumping power, thus making the cooling effect unsatisfactory and the service life is limited.

SUMMARY OF THE PRESENT INVENTION

An object of the present invention is to solve the technical problem, in view of the above-mentioned drawbacks in the existing arts, by providing a liquid cooling system and a radiator unit for application on the liquid cooling system.

According to the present invention, the foregoing and other objects and advantages are attained by a liquid cooling system, characterized in that, the system comprises:

a heat dissipating device, which comprises cooling tubes and a radiator structure arrangement on the cooling tubes, a pumping device, integrally mounted between the cooling tubes to generate power for circulation of coolant inside the cooling tubes;

a heat absorbing device attaching to a heat-generating component and arranged for heat conduction with the heat-generating component;

a tube unit which connects between the heat dissipating device and the heat absorbing device.

The system further comprises a liquid chamber which contains a predetermined amount of coolant, that the coolant is arranged for accumulating and transmitting the heat dissipated to the coolant from the heat-generating component, the liquid chamber is provided to at least one end of the cooling tube of the heat dissipating device; the pumping device comprises a pump chamber and a pump power body, at least one of the cooling tube inlet and the cooling tube outlet is connected to one of the two ends of the pump chamber, the pump power body pumps out the coolant from the cooling tube outlet to circulate through the cooling tube.

The liquid chamber is positioned at one side of the cooling tube, a partition panel for liquid partition is mounted integrally inside the liquid chamber to divide the liquid chamber into an inlet chamber and an outlet chamber, wherein the cooling tubes connect to the inlet chamber and the outlet chamber, wherein the inlet chamber has an inlet port and the outlet chamber has an outlet port, wherein the tubes connect to the inlet port and the outlet ports respectively and to the heat absorbing device.

The liquid chamber is divided into a top liquid chamber and a bottom liquid chamber which are positioned at two sides of the tube unit respectively, wherein the top liquid chamber has a partition panel for liquid partition therein to divide the liquid chamber into an inlet chamber and an outlet chamber, wherein the cooling tubes are divided into an inlet cooling tube and an outlet cooling tube which connect to the bottom liquid chamber through the inlet chamber and the outlet chamber respectively.

There are N number of inlet cooling tubes which are aligned in a side-by-side manner and are disconnected together at one section to define a window in such a manner that N number of inlet cooling tube openings are formed side-by-side at a top side and a bottom side of the window, wherein the pump chamber has N number of inlet openings and outlet openings corresponding to the window such that the pump chamber is connected to the inlet cooling tube openings at the top side and the bottom side in a sealed manner through the N number of inlet openings and outlet openings, wherein a number of the outlet cooling tubes is M, where $M > N >= 1$ (N is an integer), and the M number of outlet cooling tubes are arranged in a side-by-side manner and positioned at two sides of the inlet cooling tubes.

The pump power body comprises a motor and a power fan blade, the power fan blade is fan blade with silicon steel sheet and has a shaft of stainless steel, the heat dissipating device has one lateral side at which a fan is arranged, the fan driving an airflow for lowering a temperature of the heat dissipating device and facilitating heat dissipation.

The heat dissipating device is a set of heat dissipating sheet, the heat dissipating sheets are mounted on the outer side of the cooling tubes through coupling and fixing into position by soldering or by soldering onto the cooling tubes directly.

The heat absorbing device comprises a bottom plate for heat exchange and a coolant chamber, wherein the bottom plate for heat exchange and the coolant chamber are connected and sealed through a sealing ring.

The bottom plate for heat exchange is made of metal materials, which include alloyed copper, aluminum, aluminum alloy or alloy steel; the bottom plate for heat exchange has an inner bottom surface which has a groove structure construction such that the coolant in the coolant chamber is endlessly close to the heat-generating components.

The system includes cooling tubes and a radiator structure arrangement on the cooling tubes, a pumping device which comprises a pump chamber and a pump power body arranged inside the pump chamber, the pump chamber is integrally mounted between the cooling tubes, the pump power body generates power for circulation of coolant inside the cooling tubes; a liquid chamber connected therethrough and contains a predetermined amount of coolant, that the coolant is arranged for accumulating and transmitting the heat dissipated to the coolant from the heat-generating component, the liquid chamber is provided to at least one end of the cooling tube of the heat dissipating device, or the pump chamber is also utilized as a liquid chamber.

The present invention is based on the existing product and employs an integral arrangement of the pump body and the heat dissipating device. In this way, the pump body is positioned in the middle of the radiator unit. The fan for heat dissipation not only is used to bring away the heat from the radiator, but also to bring away the heat generated from the pump power device. Accordingly, the motor life is prolonged. Also, the space requirement is greatly reduced. The pump body is connected to four inlet and eight outlet cooling tubes, which greatly increases the heat exchange effect. The power fan blades has five fan blades with a silicon steel sheet surrounded inside and a shaft of stainless steel employed. The shaft of stainless steel provides simple processing, lower cost and durable, so that the resulting product has performance stability. Accordingly, this not only increases the strength of the bearing, but also solves the wearing problem of the central axis and bushing caused by the impeller bearing working in the water for a long time, thus greatly reducing the noise of the product and providing a very superior balancing effect, thus the lifespan is greatly increased. The cost of manufacture and assembly is also reduced. Therefore, the product assembly is convenience and efficient, and the cost can be controlled.

BRIEF DESCRIPTION OF THE DRAWINGS

In order to more clearly illustrate the technical solution of the embodiments of the present invention, the followings briefly described the drawings accompanying the description of embodiments. It will be apparent that the following drawings are merely exemplary embodiments of the present invention. For person of ordinary skill in the art, under the premise of non-creative work, other drawings can also be obtained based on these drawings. In the drawings.

In conjunction with the accompanying drawings: 1—water-pump cover locking screw, 2—water-pump cover, 3—water-pump holder locking screw, 4—water-pump stator, 5—water-pump holder, 6—water-pump sealing ring, 7—water-pump rotor, 8—water-pump body, 9—main panel unit of water-pump chamber, 10—water-pump chamber, 11—window, 12—radiator unit, 13—radiator fill hole, 14—fan, 15—fan locking screw, 16—silicon casing tube, 17—tube, 18—tube connector, 19—water-cooled head chamber, 20—water-cooled head LED decoration unit, 21—sealing ring for tube connector, 22—connector locking screw, 23—sealing ring for water-cooled head chamber, 24—copper plate for heat absorption, 25—copper plate screw, 26—pump chamber, 30—top water chamber, 31—water inlet port, 32—water outlet port, 33—fill port, 34—harmonica-shaped tube, 35—main side panel for fan mounting, 36—bottom water chamber, 37—soldered fin, 38—water-pump chamber, 39—brazed fin, 40—partition panel.

DETAILED DESCRIPTION OF THE PREFERRED EMBODIMENT

In order to make the objects, technical solutions and advantages of the present invention more clearly understood, the various embodiments are further described with the accompanying drawings in the followings. These drawings figures form a part of the embodiment, wherein the embodiment in which the present invention may be realized is described. It is to be understood that other embodiments may be used, or structural and functional modifications may be made to the embodiments described herein without departing from the scope and spirit of the present invention.

Figure 1:
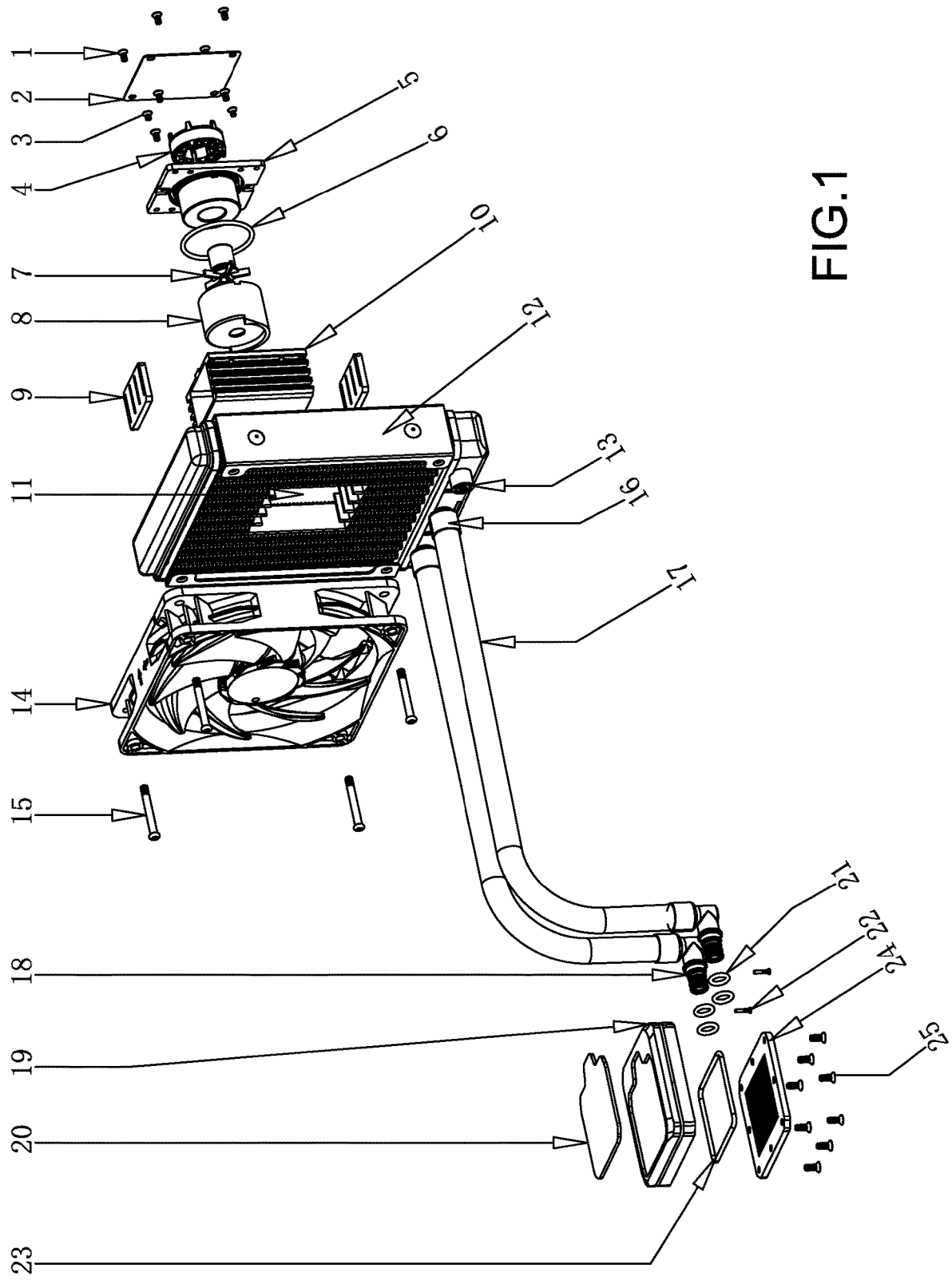
FIG. 1 is an exploded view of the product according to a preferred embodiment of the present invention.
Figure 2:
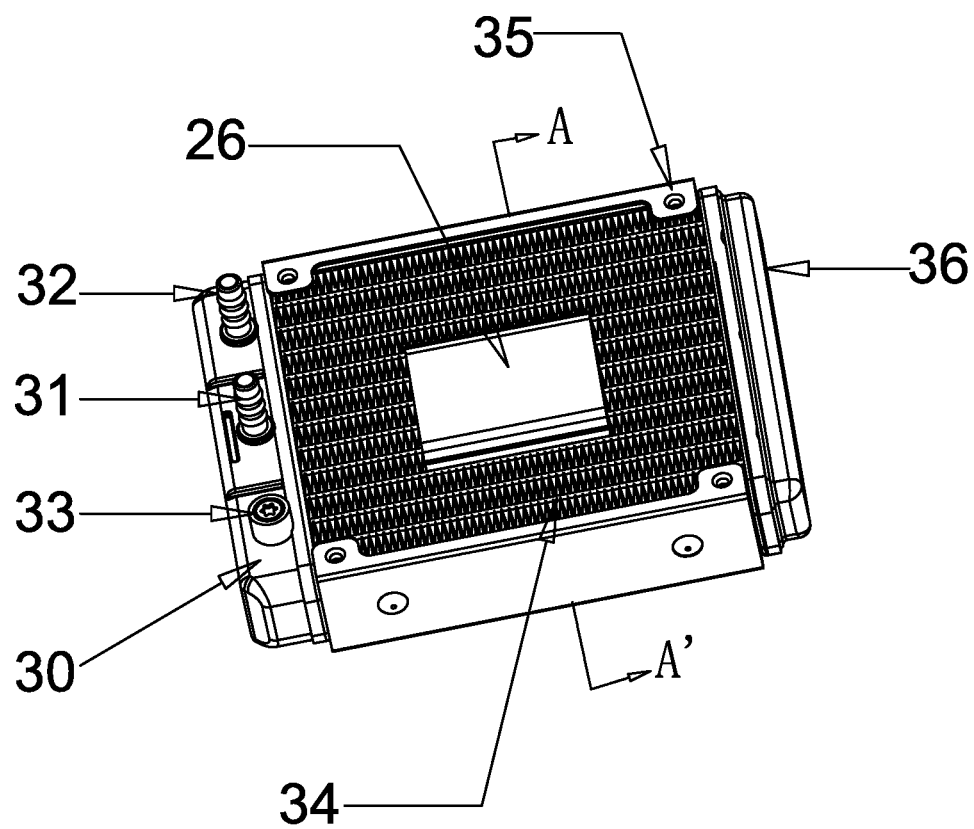
FIG. 2 is a structural illustration of a radiator unit according to a preferred embodiment of the present invention.

According to FIG. 1 of the drawings, an exploded view of the product as a whole according to a preferred embodiment of the present invention is illustrated; in conjunction with FIG. 1 and according to this embodiment, water is used as the coolant, the entire liquid cooling system comprises a fan 14, a radiator unit 12, a water pump body, a tube unit 17, a water-cooled head body, wherein the radiator unit 12 comprises a top water chamber 30, a bottom water chamber 36, as shown in FIG. 2, a partition panel welded inside the top water chamber 30 to divide the top water chamber into water inlet chamber and water outlet chamber, a water inlet port 31 and a water outlet port 32 are provided on the water inlet chamber and water outlet chamber respectively, a fill port 33 is arranged on a body of the water outlet chamber. According to this embodiment, the water inlet chamber is positioned in the middle portion of the top water chamber, the fill port 33 is channel through the water outlet 32. Four flattened and harmonica-shaped tubes 34 which are arranged side by side are connected to the water inlet chamber to form an inlet cooling tube for connecting to the bottom liquid chamber, while eight harmonica-shaped tubes 34 on two sides of the bottom liquid chamber are used to form an outlet cooling tube and are positioned side by side on two sides of the inlet cooling tubes, with four tubes on one side, then through connecting to the bottom water chamber to the water outlet chamber. In this way, the water inlet port 31 is connected to and channel through the water outlet port through connecting to the harmonica-shaped tubes 34 with four inlets and eight outlets to form a loop. In addition, fins for heat dissipation are arranged on the external side of the harmonica-shaped tubes. As shown in FIG. 2 and FIG. 1 of the drawings, according to this embodiment, the inlet cooling tube is disconnected in a middle section to form a window 36, and four tube openings of the harmonica-shaped tubes 34 which are arranged side by side are provided on each of a top side and a bottom side of the window 36. The water-pump chamber 10 has a top end opening and a bottom end opening which are welded and connected to a main panel unit of water-pump chamber 9. On the main panel unit of water-pump chamber 9, connecting ports which are complementary to the harmonica-shaped tubes are provided and are connected to the openings of the harmonica-shaped tubes on the top side and the bottom side at the disconnected portion through sealed brazing. In this embodiment, there are four corresponding connecting ports. The water-pump chamber 10 has a side opening. The water-pump chamber 10 and the main panel unit of water-pump chamber 9 are constructed into a pump chamber 26. Referring to FIG. 1 of the drawings, an installation process of the power pumping body is: a water-pump stator 4 is pressed to the inside of a water-pump holder 5 by using jig and fixture, a water-pump rotor 7 has a plurality of blades and five blades are used (of course, seven or nine blades can also be used in other embodiments) in which a silicon steel sheet is winded inside and a shaft of stainless steel is employed; the water-pump rotor 7 is placed in the axial hole of the water-pump holder 5 and then placed inside the water-pump body 8 so that a water-pump stator body is formed; then place them together in the water-pump chamber 10 which is positioned on top of the radiator unit, put on a water-pump sealing ring 6 and put on water-pump screws for locking at one time, then use electric or manual screwdriver to lock into position; and then cover a water-pump cover 2 on top of the power pumping body which is locked into position, finally, sequentially put on water-pump cover screws 1 and lock into position and sealing the side opening of the water-pump chamber 10; the entire structure and size of the pump chamber 26 is complement to the window 36, the pump chamber 26 and the power pumping body form the entire structure of the pumping device. After installation in this way, the entire pumping device is integrated completely into the radiator unit to form an integral structure, which is shown in FIG. 2.

Again, referring to FIG. 1 of the drawings, two tubes 17 are connected to tube connectors 18 respectively, a sealing ring for tube connector 21 is connected to one end of the tube connector 18, then a silicon casing tube 16 is coupled to the other end of each of the two tubes 17 such that a connecting tube body is formed, lastly, the two tube bodies are connected to the water inlet port 31 and the water outlet port 32 respectively by using fixtures such that the tube bodies are connected to the assembled radiator unit. The other end of the tube body is connected to water-cooled head body, the water-cooled head body comprises a water-cooled head chamber 19, a sealing ring for water-cooled head chamber 23 is coupled to the sealing grooves on the water-cooled head chamber 19, a copper plate for heat absorption 24 is put on top of the sealing ring for water-cooled head chamber 23 and copper plate screws 25 are put on at one time and locks into position, and finally, a water-cooled head LED decoration unit 20 is installed on top of the water-cooled head chamber 19; tube connectors 18 are linked to connecting holes on one side of the water-cooled head chamber 19 and lock into position by connector locking screws 22 such that an integrated circulating water loop is formed. Fan locking screws 15 is used to lock the fan 14 on the radiator unit 12 to assemble the integrated water cooling system.

Figure 3:
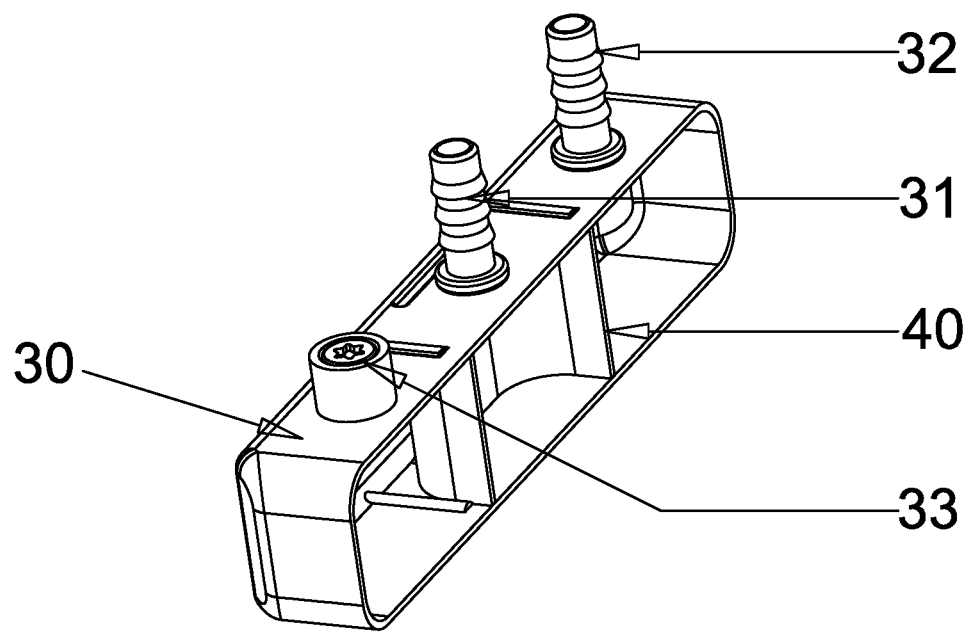
FIG. 3 is an illustration of an internal structure of a top water chamber according to a preferred embodiment of the present invention.

Referring to FIG. 3 of the drawings, an internal structure of a top water chamber according to a preferred embodiment of the present invention is illustrated. The partition panel 40 is provided in the middle portion inside the top water chamber 30 to divide the top water chamber 30 into a water inlet chamber and a water outlet chamber, the water inlet port 31 is provided on an outer side of the water inlet chamber which is in the middle portion of the water inlet chamber, a water outlet port 32 and a fill port 33 are provided on the two sides of the water outlet chamber respectively, the entire top water chamber 30 is sealed and welded together with the cooling tubes.

Figure 4:
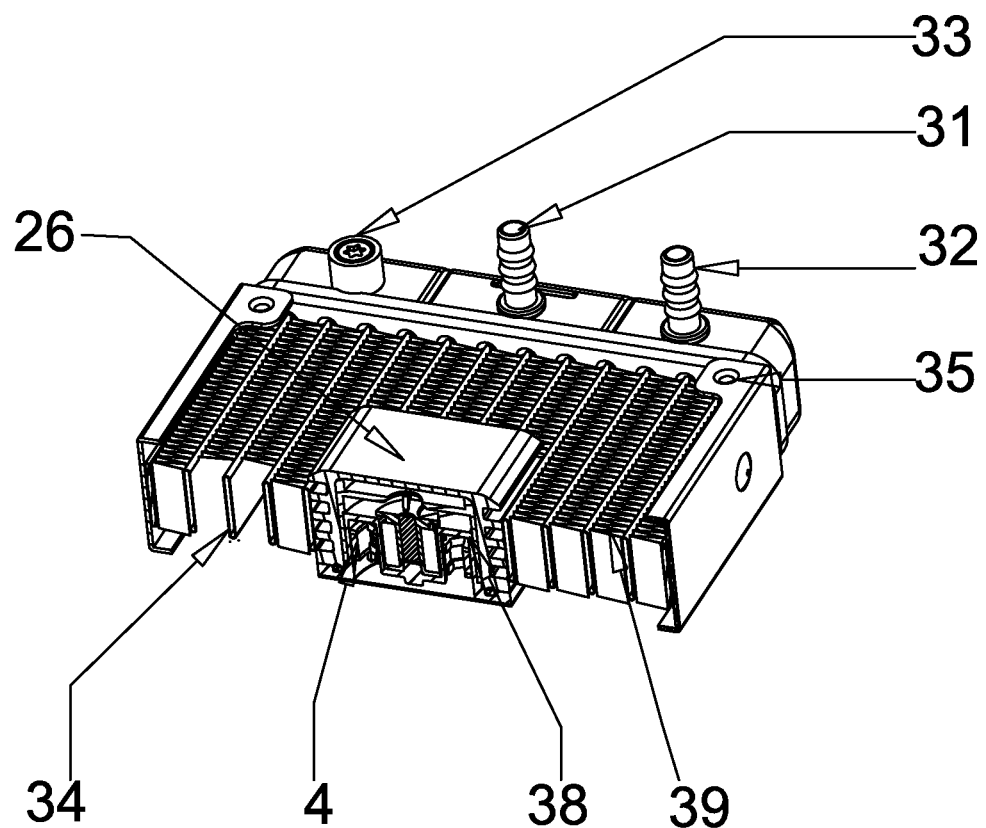
FIG. 4 is an A-A cross-sectional view of FIG. 2.

FIG. 4 is a cross-sectional view taken along the line A-A in FIG. 2. The harmonica-shaped tube 34 has a flattened structure, the four harmonica-shaped tubes 34 in the middle are sealed and connected to the pump chamber 26, the coolant flows to the water-pump chamber 38 and is pumped out through the power pumping body. Here, the brazed fins 39 is employed in this embodiment. The fins for heat dissipation employs brazing to connect between the harmonica-shaped tubes. Two main side panels for fan mounting 35 are provided at the two outermost sides respectively.

Figure 5:
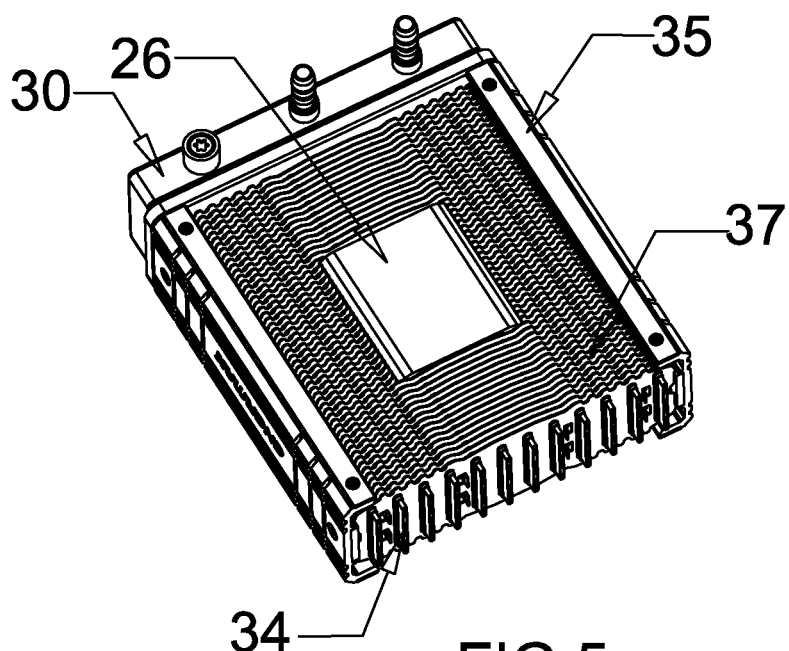
FIG. 5 is an illustration of a radiator unit, illustrating the structure when its bottom water chamber is not connected according to a preferred embodiment of the present invention.

FIG. 5 is an illustration of a radiator unit when the bottom water chamber is not connected. As shown in the figure, there are a total of twelve (12) harmonica-shaped tubes 34, four of the tubes are connecting from the top water chamber 30, through the pump chamber 26, to the bottom water chamber, then from the four harmonica-shaped tubes which are aligned side by side on each of the two sides to return to the water outlet chamber to complete the loop. In FIG. 5, the fins for heat dissipation employs wavy soldered fins 37 coupled to the outer side of the harmonica-shaped tubes 34. The two outermost sides employ main side panels for fan mounting 35 for securing the radiator into position and externally connecting the fan.

According to the cross-sectional view taken along the line A-A' in FIG. 2 of the present invention, in summary, the power pumping body comprises a motor and a power fan blades, the power fan blades has five fan blades with a silicon steel sheet surrounded inside and a shaft of stainless steel is employed. The shaft of stainless steel provides simple processing, lower cost and durable, so that the resulting product has performance stability. Accordingly, this does not only increases the strength of the bearing, but also solving the wearing problem of the central axis and bushing caused by the impeller bearing working in the water for a long time, thus greatly reducing the noise of the product and providing a very superior balancing effect, which is a good way to improve the performance of the motor. With the use of physical centripetal force and centrifugal force, the shaft is placed in the pump holder 5 and hence the lifespan of the water-pump body is greatly extended. The water-pump stator 4 is winded by six-pole coil, which greatly increasing the performance of the motor while reducing the volume and size of the motor.

The copper plate for heat absorption 24 in the water-cooled head body employs the latest groove-cutting style copper base and is capable of using other metal materials such as alloyed copper, aluminum, aluminum alloy, alloy steel and etc. The inner bottom surface of the bottom plate for heat exchange adopts a groove structure so that the coolant in the coolant chamber is endlessly close to the heat-generating devices, thus bringing away the heat from the heat-generating devices effectively.

In order to realize the above liquid-cooled radiator unit used in the liquid cooling system, this embodiment utilizes water as the coolant. Of course, other liquid which has the effect of coolant can also be used. For examples, sealed liquid nitrogen and etc. can also be used. According to this embodiment, the water inlet chamber is positioned at the middle portion in the top water chamber while the fill port 33 and the water outlet 32 are channel through, and this is not a fixed arrangement and other arrangements can also be workable. For example, their position can be arranged in one side of the radiator unit. The harmonica-shaped tube connected to the water inlet chamber can also have another shape, or the number of harmonica-shaped tube can be one or more than one provided that the number of tubes connecting to liquid-cooled outlet tubes is not smaller than that of liquid-cooled inlet tubes. Of course, it is also possible to have a smaller number of tubes as long as the entire loop of coolant is realized because the thickness of the tubes can be varied and the flow rate of the coolant can be varied. In the present preferred embodiment, the number of liquid-cooled outlet tubes is two times of the number of liquid-cooled inlet tubes while the liquid-cooled outlet tubes are positioned at the two sides of the liquid-cooled inlet tubes.

The above is a specific embodiment of the present invention. In the embodiment, amongst the fan 14, the radiator unit 12, the water-pump body, the tubes and the water-cooled head body in the entire liquid cooling system, the fan provides a faster cooling effect to the radiator unit 12. However, in the absence of fan, the present system is still workable. In the structure of the radiator unit 12, only one of the top water chamber and the bottom water chamber is required and can be defined as a water chamber, which can be located at one side of the cooling tube. As long as a water outlet port and a water inlet port is provided on the water chamber, and the water chamber is connected to the water-cooled head body such that the heat dissipating to the water from the heat generating component is accumulated and conveyed, that at this point the water pump body can be positioned at any section of the cooling tube to provide power for the cooling water to circulate inside the cooling tubes. However, if water chamber is arranged on a top and a bottom of the radiator and the pump chamber is connected to one-way flowing cooling tubes, it is necessary to disconnect all the cooling tubes with one-way flowing and connect to two sides of the pump chamber so as to ensure that the system circulates under the power provided by the pump.

It is obvious that in the above embodiment, the tube body is the tube unit. The length of the tube unit can be determined according to the actual product installation space, or can be as short as direct connection between the water-cooled head body and the radiator unit. Under certain space requirement, the water chamber can be substituted by the pump chamber directly and the tubes are directly connected to the two ends of the cooling tubes to form a water loop for circulation. The product based on the present invention can be very small in size in accordance with the space requirements of the electronic product. For examples, in its application on all-in-one computer, it requires only a very small space.

The liquid cooling system of the present invention provides superior heat dissipation to the heat-generating devices and is capable of preventing leakage at the tube connector, which can greatly enhance the lifespan of the pump body, lower the cost and reduce the existing problem of electromagnetic noise from the motor.

The present invention is based on the existing product and employs an integral arrangement of the pump device and the radiator unit. The present invention includes the fan for heat dissipation to bring away the heat from the radiator, at the same time, the heat generated from the pump power device is also blown away by the fan. Accordingly, the motor life is prolonged and the space requirement is greatly reduced. The pump device is connected to four inlet and eight outlet cooling tubes, which greatly increases the heat exchange effect. The cost of manufacture and assembly is reduced. Therefore, the product assembly is convenience and efficient, and the cost can be controlled.

One skilled in the art will understand that the embodiment of the present invention as shown in the drawings and described above is exemplary only and not intended to be limiting. It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A liquid cooling system, comprising:
   a heat dissipating device, which comprises cooling tubes and a radiator structure arrangement on said cooling tubes,
   a pumping device, integrally mounted between said cooling tubes to generate power for circulation of coolant inside said cooling tubes;
   a heat absorbing device for attaching to a heat-generating component and is arranged for heat conduction with said heat-generating component; and
   a tube unit which connects between said heat dissipating device and said heat absorbing device;
   wherein said system further comprises a liquid chamber arranged for storing a predetermined amount of coolant, that said coolant is arranged for accumulating and transmitting the heat dissipated to said coolant from said heat-generating component, said liquid chamber is provided to at least one end of said cooling tube of said heat dissipating device; said pumping device comprises a pump chamber and a pump power body, at least one of said cooling tube inlet and said cooling tube outlet is connected to one of the two ends of said pump chamber, said pump power body pumps out said coolant from said cooling tube outlet to circulate through said cooling tube;
   wherein said liquid chamber is divided into a top liquid chamber and a bottom liquid chamber which are positioned at two opposite sides of said cooling tubes, wherein said top liquid chamber has a partition panel for liquid partition therein to divide said liquid chamber into an inlet chamber and an outlet chamber, wherein said cooling tubes are divided into an inlet cooling tube and an outlet cooling tube; said inlet cooling tube interconnects said inlet chamber and said bottom liquid chamber; said outlet cooling tube interconnects said outlet chamber and said bottom liquid chamber; and
   wherein a number of said inlet cooling tubes is N and said N number of inlet cooling tubes are aligned in a side-by-side manner, wherein a section of said N number of inlet cooling tubes are disconnected to define a window in such a manner that N number of inlet cooling tube openings are formed side-by-side at a top side and a bottom side of said window, wherein said pump chamber has N number of inlet openings and outlet openings corresponding to said window such that said pump chamber is connected to said inlet cooling tube openings at said top side and said bottom side in a sealed manner through said N number of inlet openings and outlet openings, wherein a number of said outlet cooling tubes is M, where M>N≥1 (N is an integer), and said M number of outlet cooling tubes are arranged in a side-by-side manner and positioned at two sides of said inlet cooling tubes.

2. The liquid cooling system according to claim 1, wherein said pump power body comprises a motor and a power fan blade, said power fan blade is fan blade with silicon steel sheet and has a shaft of stainless steel, said heat dissipating device has one lateral side at which a fan is arranged, said fan driving an airflow for lowering a temperature of said heat dissipating device and facilitating heat dissipation.

3. The liquid cooling system according to claim 2, wherein said heat dissipating device is a set of heat dissipating sheet or heat dissipating wavy band, wherein said heat dissipating sheet are arranged on the outer side of said cooling tubes and are mounted on said outer side of said cooling tubes directly through soldering or through coupling and fixing into position by soldering.

4. The liquid cooling system according to claim 3, wherein said heat absorbing device comprises a bottom plate for heat exchange and a coolant chamber, wherein said bottom plate for heat exchange and said coolant chamber are connected and sealed through a sealing ring.

5. The liquid cooling system according to claim 4, wherein said bottom plate for heat exchange is made of metal materials, which include alloyed copper, aluminum, aluminum alloy or alloy steel; said bottom plate for heat exchange has an inner bottom surface which has a groove structure construction such that the coolant in said coolant chamber is endlessly close to the heat-generating components.

6. The liquid cooling system according to claim 1, wherein a center portion of the radiator structure forms a hollow area, and said pumping device is fitted into the hollow area.

\* \* \* \* \*